(12) United States Patent
Peschke et al.

(10) Patent No.: US 8,076,989 B2
(45) Date of Patent: Dec. 13, 2011

(54) DIFFERENTIAL WAVEGUIDE SYSTEM CONNECTED TO FRONT AND REAR NETWORK ELEMENTS

(75) Inventors: Martin Peschke, Munich (DE); Thomas Reichel, Baldham (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 99 days.

(21) Appl. No.: 12/377,833

(22) PCT Filed: Feb. 20, 2008

(86) PCT No.: PCT/EP2008/001328
§ 371 (c)(1),
(2), (4) Date: Mar. 10, 2009

(87) PCT Pub. No.: WO2008/119417
PCT Pub. Date: Oct. 9, 2008

(65) Prior Publication Data
US 2010/0301965 A1 Dec. 2, 2010

(30) Foreign Application Priority Data

Apr. 3, 2007 (DE) .................. 10 2007 016 063
Jun. 13, 2007 (DE) .................. 10 2007 027 155

(51) Int. Cl.
*H01P 3/02* (2006.01)

(52) U.S. Cl. ............................................. 333/4; 333/12
(58) Field of Classification Search .................. 333/1, 4, 333/5, 12
See application file for complete search history.

(56) References Cited

U.S. PATENT DOCUMENTS

| | | | | |
|---|---|---|---|---|
| 2,280,950 A | * | 4/1942 | Harder | 307/90 |
| 3,697,896 A | * | 10/1972 | Sarkozi et al. | 333/12 |
| 3,778,759 A | * | 12/1973 | Carroll | 367/43 |
| 5,517,487 A | * | 5/1996 | Fridland et al. | 370/200 |
| 6,097,262 A | * | 8/2000 | Combellack | 333/12 |
| 6,373,348 B1 | | 4/2002 | Hagerup | |
| 6,423,981 B1 | | 7/2002 | Nayler | |
| 7,049,901 B2 | * | 5/2006 | Sacco | 333/4 |

(Continued)

FOREIGN PATENT DOCUMENTS

DE 195 34 309 3/1997

(Continued)

OTHER PUBLICATIONS

International Search Report for PCT/EP2008/001328 dated Jun. 10, 2008.

(Continued)

*Primary Examiner* — Benny Lee
(74) *Attorney, Agent, or Firm* — Marshall, Gerstein & Borun LLP

(57) ABSTRACT

A waveguide system comprises a differential waveguide with at least one first and one second signal conductor, which are coupled to one another within the waveguide, and a divider network with front network elements disposed at a front end of the waveguide in the signal-flow direction and with rear network elements disposed at a rear end of the waveguide in the signal-flow direction. The front network elements comprise a first parallel element, which extends in the direction from the first signal conductor to the earth conductor, and a second parallel element, which extends in the direction from the second signal conductor to the earth conductor. Alternatively, the parallel element can also be disposed between the signal conductors.

37 Claims, 5 Drawing Sheets

U.S. PATENT DOCUMENTS

2002/0005060 A1    1/2002    Unland et al.
2004/0140819 A1    7/2004    McTigue et al.

FOREIGN PATENT DOCUMENTS

| | | |
|---|---|---|
| DE | 199 07 675 | 9/2000 |
| EP | 1 605 588 | 12/2005 |
| EP | 1 688 748 | 8/2006 |
| WO | WO-98/28726 | 7/1998 |

OTHER PUBLICATIONS

R.L. Witkover et al., "Beam current monitoring in the AGS booster and its transfer lines," Proceedings of the Particle Accelerator Conf., 14:1268 (May 6, 1991).

* cited by examiner

DIFFERENTIAL WAVEGUIDE SYSTEM CONNECTED TO FRONT AND REAR NETWORK ELEMENTS

BACKGROUND OF THE INVENTION

1. Field of the Invention

The invention relates to a waveguide system with a differential waveguide. Waveguide systems of this kind are required, for example, for the transmission of a test signal from a probe to a measuring instrument, for example, a spectrum analyzer, a network analyzer or an oscilloscope.

2. Related Technology

A waveguide system with a coaxial line is known, for example, from EP 1 605 588 A2. The waveguide disclosed in this document is not a differential waveguide, but a differential signal is transmitted via two separate coaxial lines and then supplied to an operational amplifier acting as an input amplifier. An input network is disposed at the front-end of each coaxial line, and a terminating network is disposed at the rear end of each coaxial line facing towards the operational amplifier. The networks are formed by ohmic resistors and capacitors.

One disadvantage of the two de-coupled, grounded waveguides according to EP 1 605 588 A2 is that a relatively-large structure is present, and the handling of the two cables by the user is awkward and impracticable. Moreover, in practice, it is difficult to manufacture two individual waveguides of exactly the same length. Even 1 mm difference in length leads to a time displacement of the differential signals relative to one another by approximately 5 ps. In the case of typical signals with a build-up time of 35 ps (equivalent to 10 GHz bandwidth), this leads to considerable signal distortions and transition from common mode to differential mode and vice versa. Moreover, with the two grounded lines, it is difficult to connect the grounds to one another at both ends with low-inductance. In general, this can only be achieved in an inadequate manner, which means that the differential current at the cable input cannot flow freely, and undesirable external modes are excited.

SUMMARY OF THE INVENTION

The invention therefore provides a waveguide system for differential signals, which provides only extremely-small delay-time differences and a small structure, and which guarantees an adequate attenuation of the common mode.

A differential waveguide, of which the signal conductors are coupled to one another within the waveguide and, preferably but not necessarily, separated from the common ground conductor, is used according to the invention. The divider network is subdivided into front network elements, which are disposed at the front end of the waveguide, and rear network elements, which are disposed at the rear end of the waveguide.

In this context, the front network elements preferably have parallel elements, which extend from the first or respectively second signal conductor in the direction towards the common ground conductor and/or between the two signal conductors.

By comparison with the use of two de-coupled and separately grounded waveguides, the use of a differential waveguide provides the initial advantage of a smaller structure. This advantage is particularly evident, if striplines are used instead of coaxial waveguides. Since the waveguides cannot be shielded completely from one another in the latter context, large safety distances must be observed between the waveguides when two separate waveguides are used in order to avoid a coupling. With the use of a differential waveguide, however, the coupling is in fact desirable and necessary. A special safety distance need not be observed. On the contrary, the waveguides must be positioned relatively close to one another.

Moreover, identical lengths for the signal conductors of the waveguide are achieved automatically. The two signal conductors are subjected to the same thermal expansion because of their spatially-adjacent arrangement, which is not the case with individual conductors, if one of the two conductors is disposed in the proximity of a heat source, such as a power component.

One particular advantage, however, is that a common ground conductor is present, and not two individual grounds, which must then be connected to one another. The problem of the low-inductance connection of two individual grounds therefore does not occur at all with the differential waveguide according to the invention. Furthermore, differential waveguides can be designed in such a manner that the undesirable common mode is subjected to a very high attenuation. Accordingly, undesirable common-mode interference can already be absorbed in the divider. With the use of a parallel element in the front network element of the divider, especially low-frequency, common-mode interference, for example, a 50 Hz or 60 Hz humming signal from the power supply network, is not coupled into the waveguide in the first place, but already absorbed upstream of the waveguide.

By preference, the differential waveguide has a resistance load per unit length, that is to say, the first signal conductor and/or the second signal conductor and/or the ground conductor has an ohmic resistance different from zero. This helps to attenuate and therefore to suppress undesirable multiple reflections more strongly.

The special topological design in some embodiments of the front network elements and the rear network elements with ohmic resistors and capacitors and their special dimensions leads to a waveguide system with particularly-favorable properties and a frequency-independent voltage amplification for the differential mode across almost the entire usable bandwidth.

Different configurations are possible for the waveguide system according to the invention. In principle, a double coaxial line, for example, in the form of two coaxial lines or one coaxial line with two internal conductors, which may, for example, be twisted, is also conceivable; however, an embodiment by means of a flexible or rigid stripline, especially using coplanar technology (coplanar), grounded coplanar, microstripline technology and/or triplate technology, is preferable.

BRIEF DESCRIPTION OF THE DRAWINGS

Exemplary embodiments of the invention are described by way of example below with reference to the drawings, wherein like features in different drawing figures are designated by the same reference labels. The drawings are as follows.

DETAILED DESCRIPTION OF THE INVENTION

Before a more detailed description of exemplary embodiments of the invention is provided, the following paragraphs initially outline the principle of differential waveguides. Differential waveguides according to the invention are used in order to transmit differential signals over relatively-long distances. In general, these consist of an earth conductor and two signal conductors.

Since an interaction occurs in the case of differential waveguides both between the signal conductor and the ground conductor and also between the two signal conductors, they are described by two independent waveguide modes, each with its own characteristic impedance and its own propagation constant. In many cases, a description through an even and an odd mode is meaningful. The associated impedances are then referred to as Zeven and Zodd. In this context, Zeven and Zodd describe the relationship between the voltage of a signal conductor relative to the reference ground and the current along this conductor for in-phase or respectively anti-phase excitation of both signal conductors. Alternatively, a description via a differential mode and a common mode with the impedances ZDM =2·Zodd and ZCM=Zeven/2 is possible. In order to terminate both the common mode and also the differential mode in a reflection-free manner, a network A of three elements 1, 2 with impedance Z1 and element 3 with impedance Z2, as shown in FIG. 1, replaces the simple terminal resistor, which is known from grounded lines.

Front network elements are disposed at a front end of the waveguide in a signal-flow direction with rear network elements disposed at a rear end of the waveguide in the signal flow direction. The front network elements preferably comprise a first parallel element, which extends in a direction from the first signal conductor to a ground conductor, and a second parallel element, which extends in a direction from the second signal conductor to the ground conductor, and/or one parallel element, which extends between the signal conductors.

Figure 1:
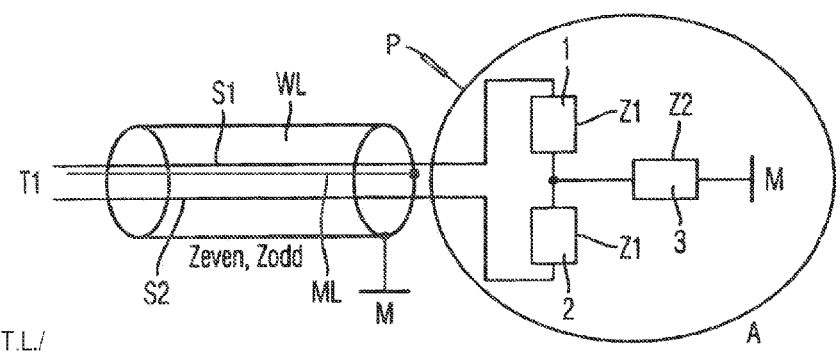
FIG. 1 shows a differential waveguide with terminal resistors.
Figure 2:
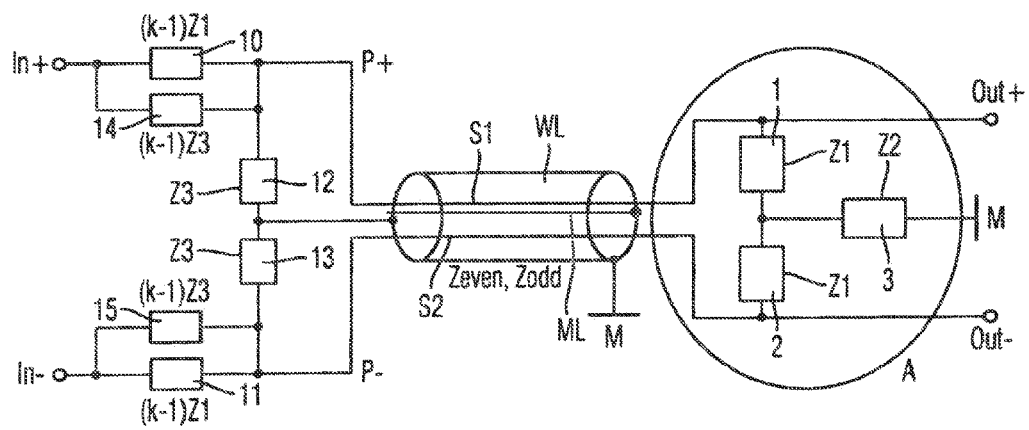
FIG. 2 shows a basic exemplary embodiment of the waveguide system according to the invention.

As specifically illustrated in FIGS. 1 and 2, signal conductors S1 and S2 are separated by a common ground conductor ML of the waveguide wherein the differential waveguide has a resistance load per unit length wherein at least one of the first signal conductor S1, the second signal conductor S2, and a ground conductor ML has an ohmic resistance significantly different from zero.

As shown in FIG. 1, the waveguide system preferably connects a differential probe (P) to a spectrum analyzer, a network analyzer, or an oscilloscope.

Accordingly, the following relationships apply for the reflection-free terminal:

$$Z1 = Zodd \qquad (1)$$

$$Z2 = 0.5 \cdot (Zeven - Zodd) \qquad (2)$$

In this context, the impedances Z1 or Z2 are generally complex values, if the impedance levels Zeven and Zodd are complex values. In every case, as also for the grounded line, the terminal network A can be seen directly at the input T1 of a differential, especially a lossy, line, if it is terminated according to FIG. 1 both for the common mode and also for the differential mode with the corresponding complex impedance level.

The network of differential waveguide and terminal network described above can now be expanded, as illustrated in FIG. 2, to form a balanced divider network with the division factor 1:k for the differential mode. In this context, two series resistors 10, 11 of value (k−1)Z1 are added at both inputs P+ and P− of the differential waveguide WL. Further divider elements 12, 13 of size value Z3 and 14, 15 of size value (k−1)Z3 can also be added optionally. The network provided in this manner is a compensated divider for the differential mode with smooth frequency response with reference to the nodes P+ and P−. This is evident, if the terminal network A, instead of the waveguide WL, is inserted directly between the points P+ and P−.

The differential waveguide WL preferably is a flexible stripline or a rigid stripline, and highly preferably is a stripline designed using at least one of coplanar technology, grounded coplanar technology, microstripline technology, and triplate technology.

At the output Out+, Out− of the divider, the same voltage is provided as at the input P+, P− of the waveguide WL, because it is a waveguide terminated in a reflection-free manner. In the case of a lossy waveguide, its attenuation must also be taken into consideration in the division ratio.

Figure 3:
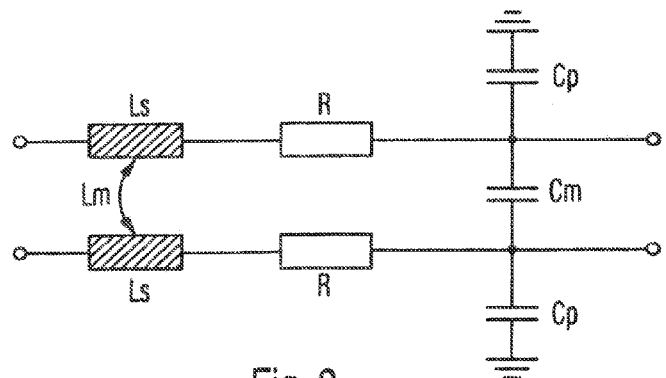
FIG. 3 shows the equivalent circuit diagram of an infinitesimal section of the differential waveguide used within the framework of the invention.

An infinitesimal section of the differential waveguide is characterized by the equivalent circuit diagram in FIG. 3.

In this context, the length-specific series inductances Ls coupled via the coupling inductance Lm have a value of, for example, Ls=236 nH/m; the value of the length-specific coupling inductance Lm is, for example, Lm=Ls/2. The values of the length-specific capacitances Cp to ground and the coupling capacitance Cm are, for example, Cp=Cm=94.3 pF/m.

Additionally, the losses of the heating resistor R are contained through a resistance load per unit length of, for example, R=750 ohms/m. In general, the following relationships apply for differential waveguides (DM =differential mode, CM =common mode, even =even mode, odd =odd mode):

$$CDM = Cm + Cp/2 \qquad LDM = 2 \cdot (LS - Lm)$$
$$CCM = 2 \cdot Cp \qquad LCM = (LS + Lm)/2$$
$$Codd = Cp + 2 \cdot Cm \qquad Lodd = Ls - Lm$$
$$Ceven = Cp \qquad Leven = Ls + Lm$$

-continued $$RDM = 2 \cdot R$$

$$RCM = R/2$$

$$Rodd = R$$

$$Reven = R$$

$$Zi = \sqrt{\frac{Ri + j\omega Li}{j\omega Ci}} \sqrt{\frac{Ri + j\omega Li}{j\omega Ci}} \; ; i = DM, CM, \text{odd, even}$$

Figure 4:
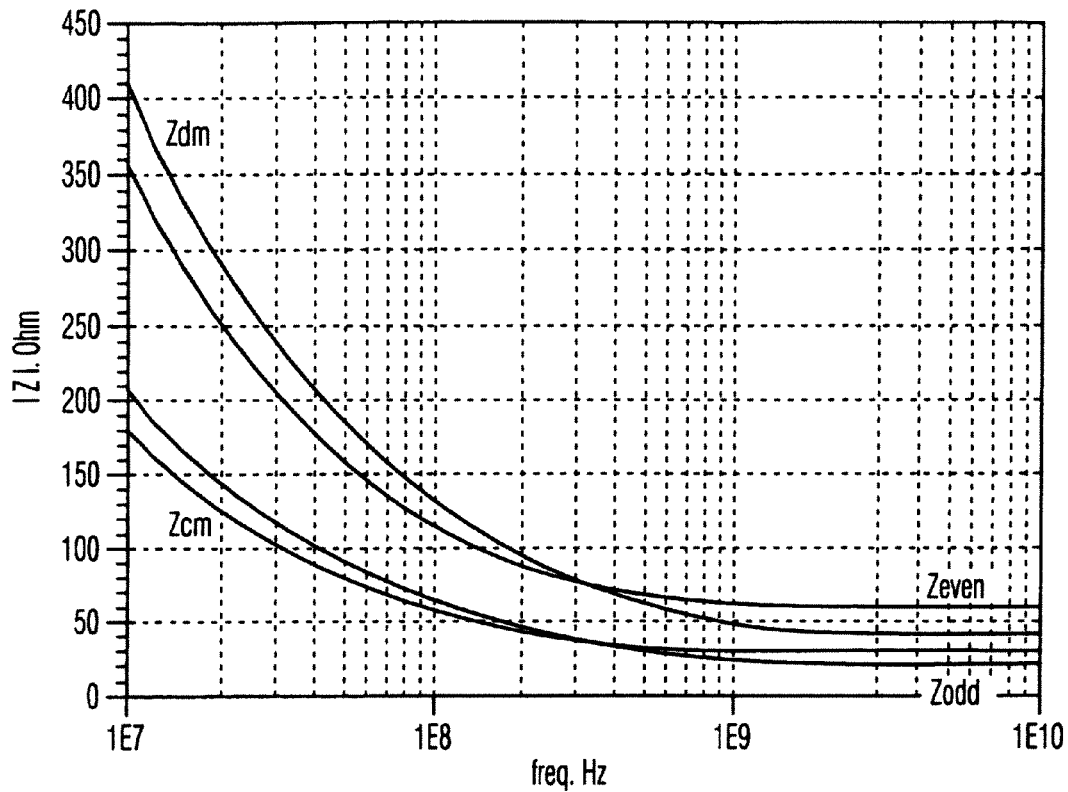
FIG. 4 is a graph showing values "|Z|.ohm" of impedance levels as a function of frequency for differential ("differential") mode ZDM, common mode ("common") mode ZCM, even ("even") mode Zeven, and odd ("odd") mode Zodd, of the exemplary differential waveguide from FIG. 3.

FIG. 4 shows the calculated values of the wave impedances ZDM (in FIG. 4 Zdm), ZCM (in FIG. 4 Zdm), Zeven, and Zodd of the individual modes for the differential waveguide from FIG. 3. For high-frequencies, they adopt the value of a loss-free (R=0) waveguide.

Figure 5:
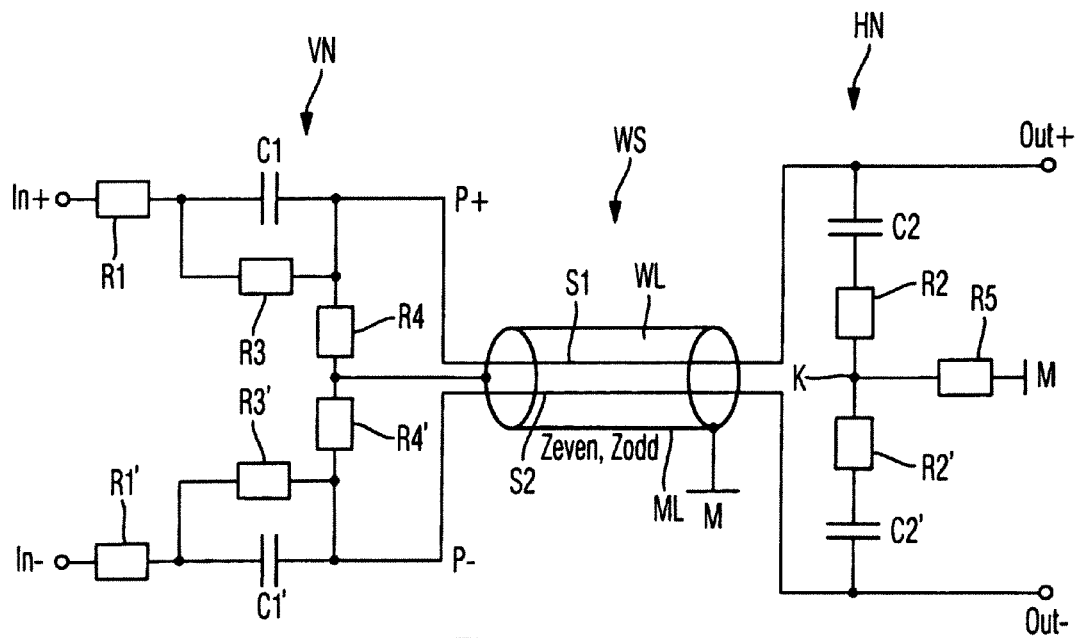
FIG. 5 shows a concrete exemplary embodiment of the waveguide system according to the invention.

FIG. 5 shows an exemplary embodiment of the waveguide system WS according to the invention, which contains a differential waveguide as shown in FIG. 3 and has been optimized on the basis of the above considerations. The waveguide system WS has a differential waveguide WL with a first signal conductor S1 and a second signal conductor S2. The signal conductors S1 and S2 are coupled to one another and, in the exemplary embodiment, galvanically separated from a common ground conductor ML. The exemplary embodiment illustrated in FIG. 5 shows a coaxial, differential waveguide, wherein the signal conductors S1 and S2 are disposed in the proximity of the central axis, but offset somewhat in a radial, symmetrical manner from the central axis. The ground conductor ML therefore surrounds the two signal conductors S1 and S2 completely in the radial direction, so that the signal conductors S1 and S2 are completely shielded from the outside. The two signal conductors S1 and S2 are arranged so close to one another, that an electromagnetic coupling of the two signal conductors S1 and S2 is brought about. An infinitesimal portion of the waveguide illustrated in FIG. 5 can therefore be described with the equivalent circuit diagram according to FIG. 3. Overall, the line is, for example, 50 mm long.

Furthermore, a divider network with front network elements VN disposed at a front end of the waveguide WL in the signal-flow direction and with rear network elements HN disposed at the rear end of the waveguide WL in the signal-flow direction is provided. The divider network with its rear network elements is used for termination of the waveguide WL. In this context, because of the complex impedance levels Zeven, Zodd, a combination of resistive and reactive components is required. It also represents a compensation network. In this context, with appropriate dimensioning, a differential input voltage present between the input connections In+ and In− in a fixed divider ratio, which is substantially dependent upon the frequency, is converted into an output voltage present between the output connections Out+ and Out−.

$$AVDM(\text{differential voltage amplification}) = \frac{Vout^+ - Vout^-}{Vin^+ - Vin^-} \approx const$$

A frequency-independent divider ratio of this kind is necessary especially in the case of probes for oscilloscopes.

The front network elements VN comprise a first parallel element R4, which extends from the first signal conductor S1 to the ground conductor ML, and a second parallel element R4', which extends from the second signal conductor S2 to the common ground conductor ML. The first parallel element R4 and the second parallel element R4' are preferably formed as a first and second ohmic resistor R4, R4', wherein the resistance value of the first and second ohmic resistor R4 and R4' is preferably within the range from 1 kohm to 10 kohms, by preference within the range from 4.5 kohms to 5.5 kohms. One particularly preferred value determined by simulation is disposed at 5.0 kohms.

Within the framework of the present patent application, the term series element should be understand to mean a network element or a group of network elements, which is connected in the signal path between one of the input connections In+ and In− and the output connections Out+ and Out− and has no connection to the circuit ground M. The term parallel element should be understood within the framework of this patent application to mean that it is not disposed in this signal path, but refers to network element or a group of network elements, across which one of the signal paths is connected directly or indirectly to the circuit ground M or the other signal path.

Furthermore, the front network elements VN comprise first series elements R1, C1, R3, which connect the first input connection In+ to the first signal conductor S1. Moreover, further series elements R1', C1', R3' are present, which connect the second input connection In− to the second signal conductor S2. In this context, the first series elements preferably consist of a series wiring of a third ohmic resistor R1 with a parallel wiring of a fourth ohmic resistor R3 and a first capacitor C1. In a corresponding manner, the two series elements preferably consist of a series wiring of a fifth ohmic resistor R1' with a parallel wiring of a sixth ohmic resistor R3' and a second capacitor C1'.

The resistance value of the third ohmic resistor R1 and of the fifth ohmic resistor R1' is preferably disposed within the range from 50 ohms to 200 ohms, by preference within the range from 70 ohms to 150 ohms. It has been determined by simulation that the value 100 ohms is particularly suitable.

The resistance value of the fourth ohmic resistor R3 and of the sixth ohmic resistor R3' is preferably disposed within the range from 10 kohms to 100 kohms, by preference within the range from 30 kohms to 60 kohms. In this context, it has been shown by simulation that the value of 45 kohms is particularly advantageous.

The capacitance value of the first capacitor C1 and of the second capacitor C1' is preferably within the range from 0.1 pF to 5 pF, by preference within the range from 0.5 pF to 1 pF. A value of 0.64 pF has proved particularly suitable in simulation.

Although the series wiring of the series elements can also be replaced in principle, it has proved advantageous, if the first capacitor C1 and the fourth resistor R3 are connected to the first signal conductor S1 of the differential waveguide WL and to the first resistor R1. In a corresponding manner, the second capacitor C1' and the sixth resistor R3' are connected to the second signal conductor S2 of the differential waveguide WL and to the second resistor R4'.

The rear network elements HN preferably consist of a series wiring of a third capacitor C2 and a seventh ohmic resistor R2 and a fourth capacitor C2' and an eighth ohmic resistor R2' and a ninth ohmic resistor R5. In this context, the first signal conductor S1 of the waveguide WL is connected to a common node K via the series wiring of the third capacitor C2 and the seventh ohmic resistor R2, while the second signal conductor S2 of the waveguide WL is connected to the common node K via the series wiring of the fourth capacitor C2' and the eighth ohmic resistor R2'. The common node K is then connected to the circuit ground M via the ninth ohmic resistor R5.

The capacitance of the third capacitor C2 and of the fourth capacitor C2' is preferably disposed within the range from 0.5 pF to 15 pF, by particular preference within the range from 1 pF to 5 pF. In this context, it has been shown by simulation, that a value of 1.5 pF leads to particularly good results.

The values of the seventh to the ninth resistors R2, R2' and R5 result from the condition for the reflection-free termination of a differential conductor from Formula (1) and (2). The preferred values: Zodd=20.5Ω, Zeven=61.5Ω can be determined from FIG. 4 for high-frequencies >5 GHz for the conductor from FIG. 3. Accordingly, the following applies: R2=2'=Zodd=20.5Ω, R5=0.5 (Zeven−Zodd)=20.5Ω. In practice, the values for R2, R2' and R5 can differ from the theoretically-determined values as a result of parasitic effects in order to achieve a better matching for frequencies <1 GHz, at which Zeven and Zodd have not yet reached their final value. However, their value is generally disposed within the range of a few times 10 ohms or slightly above 100 ohms. R5 can also be set as a direct ground connection at 0 ohms.

The resistance value of the seventh ohmic resistor R2 and of the eighth ohmic resistor R2' is preferably disposed within the range from 10 ohms to 250 ohms, by particular preference within the range from 75 ohms to 150 ohms. In this context, a value of approximately 125 ohms has proved particularly appropriate.

The resistance value of the ninth ohmic resistor R5 is also preferably disposed within the range from 1 ohm to 100 ohms, wherein a range from 10 ohms to 30 ohms is particularly preferred. Here also, a value of 20.5 ohms has proved particularly suitable.

The series wiring of the parallel elements in the rear network elements HN in the exemplary embodiment illustrated is arranged in such a manner that, on one hand, the third capacitor C2 is connected to the first signal conductor S1 of the differential waveguide WL and to the first output connection Out+ and, on the other hand, the fourth capacitor C2' is connected to the second signal conductor S2 and the second output connection Out−. By contrast, the ohmic resistors R2 and R2' are connected to the common node K. However, the inverse sequence is also possible.

Figure 6:
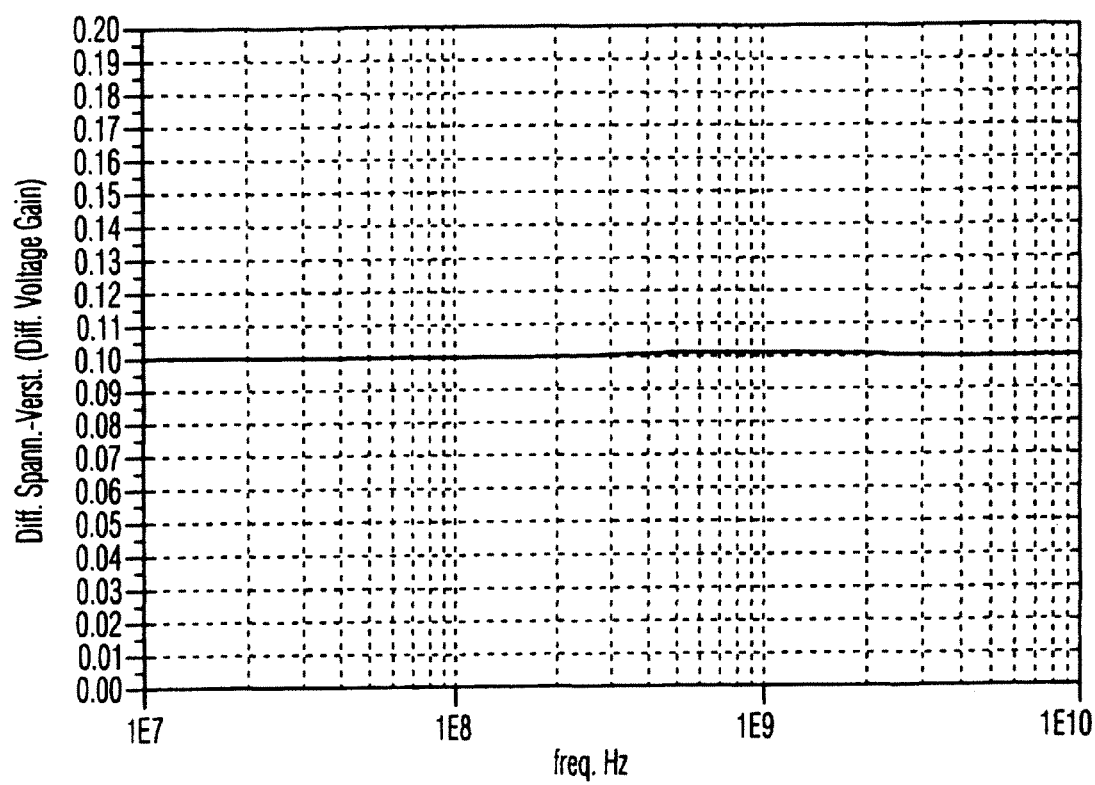
FIG. 6 is a graph showing the voltage transmission function (in terms of differential voltage gain vs. frequency) of the compensated divider from FIG. 5 with differential waveguide.

With appropriate dimensioning of the individual network elements, a characteristic of the differential voltage amplification is obtained largely independent of frequency, as illustrated in FIG. 6. In this context, the differential voltage amplification is defined as follows:

$$AVDM\text{(differential voltage amplification)} = \frac{Vout^+ - Vout^-}{Vin^+ - Vin^-}$$

The resulting, almost frequency-independent divider ratio can be visualized very roughly as follows: at low input frequencies or respectively with a direct current between the input connections In+ and In−, the duty factor is determined by the ratio (R1+R3)/R4. In the middle frequency range, the duty factor is substantially determined by the ratio of the reactances of the capacitors C1 or respectively C1' to C2 or respectively C2'. In the high-frequency range, the capacitors C1 and C1' short-circuit the resistors R3 and R3', and the resistors R2 and R2' are activated on the first signal conductor S1 and on the second signal conductor S2. Accordingly, in the high-frequency range, the duty factor is determined by the ratio of the resistors R1 or respectively R1' to the parallel wiring of R4 and R2 or respectively R4' and R2', which is characterized by the low resistance value of R2 or respectively R2'. However, the above explanation is extremely simplified and serves only for the purpose of visualization.

Accordingly, the waveguide system according to the invention has a compensated, differential divider network, which provides a high input resistance and a low input capacitance, and which can, however, be extended over a spatially-large region by a waveguide. A waveguide system of this kind is advantageous for many applications, in which spatial conditions require the bridging of a large distance, while electrical requirements demand minimum extension. The requirement of the prior art, that a concentrated divider network must be smaller than 1/10 of the wavelength, so that propagation effects do not play a role, is therefore overcome.

Instead of the coaxial, differential waveguide presented in FIG. 5, waveguides designed using stripline technology are used by preference. Possible exemplary embodiments are presented in FIGS. 7 to 10. By way of visualization, the electrical field E and the magnetic flux B have been indicated in FIGS. 7 to 10.

Figure 7:
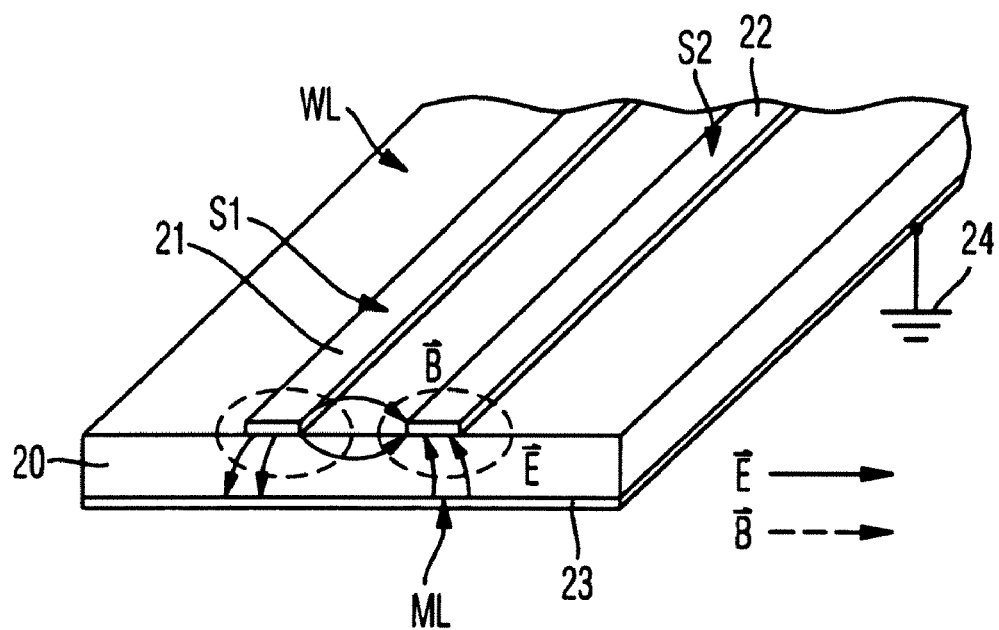
FIG. 7 shows a first exemplary embodiment of the differential waveguide used for the waveguide system according to the invention in coupled microstripline technology in a perspective view.

FIG. 7 shows the differential waveguide WL in microstripline technology in a perspective view. In this context, on the upper side of a substrate 20, a first stripline 21 is arranged as the first signal conductor S1 and a second stripline 22 is arranged as the second signal conductor S2. A continuous metal layer 23, which forms the ground conductor ML and is disposed at ground potential (ground) 24, is arranged on the underside of the substrate 20. If the substrate 20 is made from a flexible material, the differential waveguide is particularly easy to handle.

Figure 8:
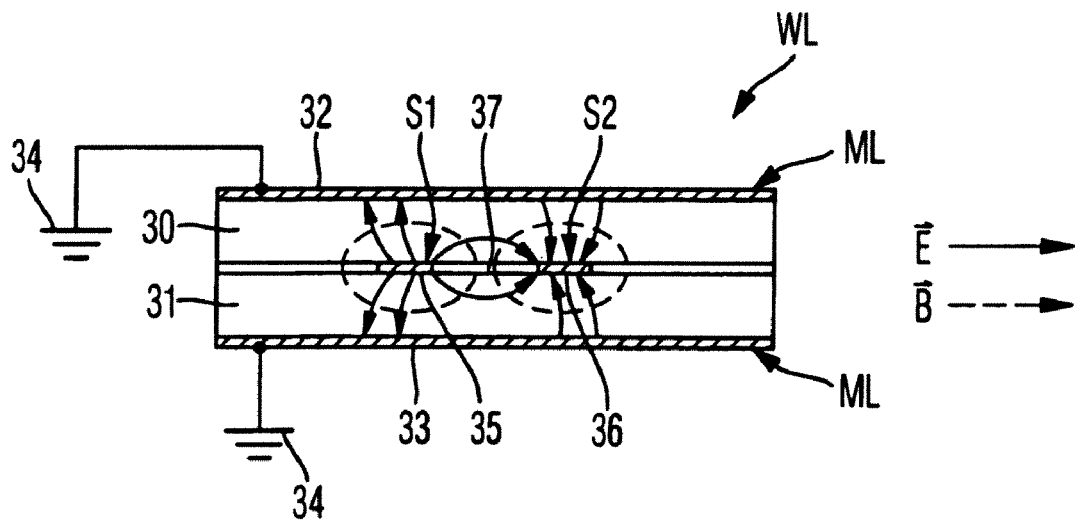
FIG. 8 shows a second exemplary embodiment of the differential waveguide used for the waveguide system according to the invention in triplate technology in a cross-sectional view.

FIG. 8 shows the formation of the waveguide WL in triplate technology. In this context, two dielectric substrates 30 and 31, both of which are provided with a continuous metal coating 32 or respectively 33 on their outer surface, are shown. These metal layers are each connected to the ground potential (ground) 34 and form the ground conductor ML. The first signal conductor S1 and the second signal conductor S2 are arranged as thin striplines 35 and 36 between the substrates 30 and 31, wherein the regions 37 in this layer between the two substrates 30 and 31 can be filled with a dielectric filling medium, for example, a synthetic resin. By contrast with the perspective view in the exemplary embodiment of FIG. 7, only a sectional plane is presented in FIG. 8 by way of simplification.

Figure 9:
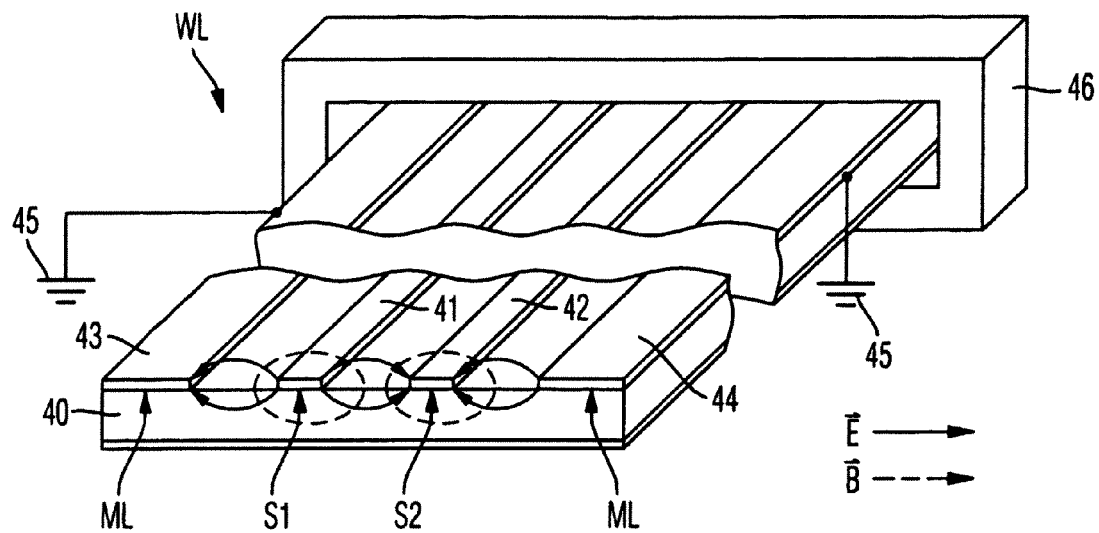
FIG. 9 shows a third exemplary embodiment of the differential waveguide used for the wave guide system according to the invention in coplanar technology in a perspective view.

FIG. 9 shows a further exemplary embodiment of the waveguide WL in coplanar technology in a perspective view. Here also, the first signal conductor S1 and the second signal conductor S2 are formed on the dielectric substrate 40 as thin metallic strips 41 and 42. A metal layer 43 or respectively 44, which is connected in each case to the ground potential 45, is disposed on both sides alongside the signal conductors S1 and S2. These two metallic layers 43 and 44 therefore form the ground conductors ML.

In the exemplary embodiment illustrated in FIG. 9, an annular core 46 made from a magnetic, preferably ferrimagnetic, material, which encloses the waveguide WL, is provided in the proximity of one end of the waveguide WL.

Common-mode interference can be absorbed through the annular core 46, because waves traveling in the common mode through the waveguide WL, in which the currents in the signal conductors S1 and S2 are not directed towards one another, as in the differential mode, but rather in the same flow direction, generate an induction in the annular core 46, so that the common-mode wave is absorbed. However, the differential wave can pass unhindered through the annular core. The annular core 46 can also be disposed within the housing of a measuring instrument, from which the waveguide WL is guided, so that the annular core 46 is not visible towards the outside and does not impair handling.

Figure 10:
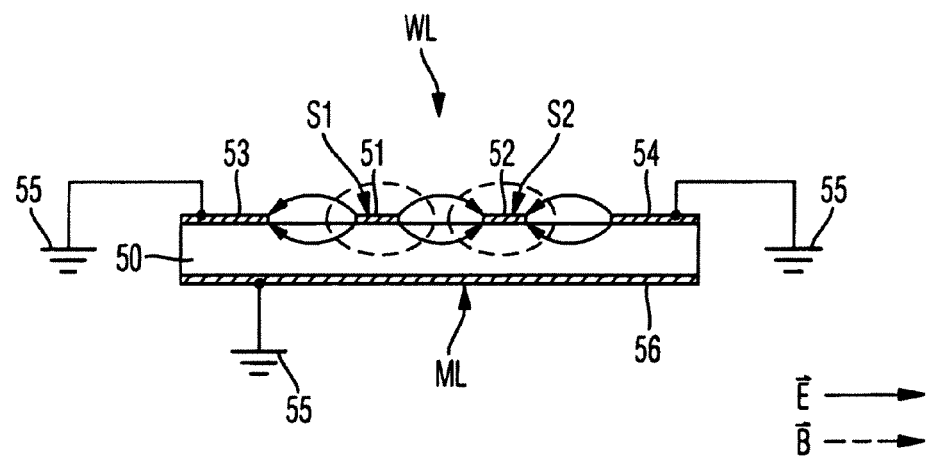
FIG. 10 shows a fourth exemplary embodiment of the differential waveguide used for the waveguide system according to the invention in grounded-coplanar technology in a cross-sectional view.

FIG. 10 shows a further exemplary embodiment of the waveguide in grounded coplanar technology (grounded coplanar). By way of simplification, only a section is shown here. As with the waveguide according to FIG. 9 formed in coplanar technology, the two signal conductors S1 and S2 are applied as thin striplines 51 and 52 on the upper side of the substrate 50, and the ground surfaces 53 and 54 are disposed alongside the striplines 51 and 52. The difference is that, an additional ground surface 56 is provided on the underside of the substrate 50. The ground surfaces 53, 54 and 56 are connected to ground potential 55. With this embodiment, a better shielding in the downward direction is achieved by comparison with the embodiment according to FIG. 9. However, the optimum shielding is achieved with the triplate technology according to FIG. 8.

The invention is not restricted to the exemplary embodiments presented. Alongside the exemplary embodiments of the differential waveguide WL shown in FIGS. 5 and 7 to 10, a series of other embodiments is also conceivable. The divider network need not be dimensioned exactly with the above-named values. It is conceivable that other value combinations and other circuit topologies could lead to identical or comparable results.

The resistor R3 or respectively R3' in FIG. 5 could also be arranged, parallel to R1 and R2 or respectively R1' and R2', as shown in FIG. 2, instead of parallel to C1 or respectively C1'. In practice, however, it has been shown that it is advantageous, if the resistors R1 and R1' are disposed as close as possible to the input of the divider, so that the divider input cannot be short-circuited by parasitic capacitances. However, the network is still a compensated divider, because R3 or respectively R3' is so large that the parallel wiring of C1 and R3 or respectively C1' and R2' at high frequencies, at which R1 or respectively R1' is active, is dominated exclusively by C1 or respectively C1'.

The invention claimed is:

1. Waveguide system comprising a differential waveguide with at least one first signal conductor and one second signal conductor coupled to one another within the waveguide, and a divider network with front network elements disposed at a front end of the waveguide in a signal-flow direction and with rear network elements disposed at a rear end of the waveguide in the signal-flow direction, wherein the front network elements comprise first series elements that connect a first input connection to the first signal conductor, and second series elements that connect a second input connection to the second signal conductor, and wherein the first series elements comprise a series wiring of a third ohmic resistor with a parallel wiring of a fourth ohmic resistor and a first capacitor.

2. Waveguide system according to claim 1, wherein the at least one first and second signal conductors are separated from each other by a common ground conductor of the waveguide.

3. Waveguide system according to claim 2, wherein the differential waveguide has a resistance load per unit length wherein the at least one of the first signal conductor, the second signal conductor, and the ground conductor has an ohmic resistance significantly different from zero.

4. Waveguide system according to claim 1, wherein the differential waveguide is terminated with the rear network elements in a reflection-free manner.

5. Waveguide system according to claim 1, wherein the front network elements comprise a first parallel element, which extends in a direction from the first signal conductor to a ground conductor, and a second parallel element, which extends in a direction from the second signal conductor to the ground conductor, and/or one parallel element, which extends between the signal conductors.

6. Waveguide system according to claim 5, wherein the first and second parallel elements of the front network elements are a first ohmic resistor and a second ohmic resistor respectively.

7. Waveguide system according to claim 6, wherein the resistance value of the first or second ohmic resistor is respectively disposed within the range from 1 kohm to 10 kohms.

8. Waveguide system according to claim 7, wherein the resistance value of the first and/or second ohmic resistors is respectively disposed within the range from 4.5 kohms to 5.5 kohms.

9. Waveguide system according to claim 8, wherein the resistance value of the first and/or second ohmic resistors is respectively disposed at approximately 5.0 kohms.

10. Waveguide system according to claim 1, wherein the second series elements comprise a series wiring of a fifth ohmic resistor with a parallel wiring of a sixth ohmic resistor and a second capacitor.

11. Waveguide system according to claim 10, wherein the resistance value of the third or fifth ohmic resistor is respectively disposed within the range from 50 ohms to 300 ohms.

12. Waveguide system according to claim 11, wherein the resistance value of the third and/or fifth ohmic resistor is respectively disposed within the range from 70 ohms to 150 ohms.

13. Waveguide system according to claim 12, wherein the resistance value of the third and/or fifth ohmic resistor is respectively disposed at approximately 100 ohms.

14. Waveguide system according to claim 10, wherein the first capacitor and the fourth ohmic resistor are connected to the first signal conductor of the differential waveguide and to the first resistor or the second capacitor, and the sixth ohmic resistor is connected to the second signal conductor of the differential waveguide and to the second resistor.

15. Waveguide system according to claim 10, wherein the resistance value of the fourth ohmic resistor or sixth ohmic resistor is respectively disposed within the range from 10 kohms to 100 kohms.

16. Waveguide system according to claim 15, wherein the resistance value of the fourth and/or sixth ohmic resistor is respectively disposed within the range from frm 30 kohms to 60 kohms.

17. Waveguide system according to claim 16, wherein the resistance value of the fourth and/or sixth ohmic resistor is respectively disposed at approximately 45 kohms.

18. Waveguide system according to claim 10, wherein the capacitance value of the first capacitor or second capacitor is respectively disposed within the range from 0.1 pF to 5 pF.

19. Waveguide system according to claim 18, wherein the capacitance value of the first and/or second capacitor is respectively disposed within the range from 0.5 pF to 1 pF.

20. Waveguide system according to claim 19, wherein the capacitance value of the first and/or second capacitor is respectively disposed at approximately 0.64 pF.

21. Waveguide system according to claim 1, wherein the differential waveguide is a double-coaxial line.

22. Waveguide system according to claim 1, wherein the differential waveguide is a flexible stripline or a rigid stripline.

23. Waveguide system according to claim 22, wherein the stripline is designed using at least one of coplanar technology, grounded coplanar technology, microstripline technology, and triplate technology.

24. Waveguide system according to claim 1, wherein the waveguide system connects a differential probe to a measuring instrument.

25. Waveguide system according to claim 24, wherein the waveguide system connects the differential probe to a spectrum analyzer, a network analyzer, or an oscilloscope.

26. Waveguide system according to claim 1, wherein the rear network elements connect the first signal conductor of the waveguide to a common node via a series wiring of a third capacitor and a seventh ohmic resistor, and the second signal conductor of the waveguide to the common node via a series wiring of a fourth capacitor and an eighth ohmic resistor.

27. Waveguide system according to claim 26 wherein the capacitance value of the third capacitor or fourth capacitor is respectively disposed within the range from 0.5 pF to 15 pF.

28. Waveguide system according to claim 27, wherein the capacitance value of the third and/or fourth capacitor is respectively disposed within the range from 1 pF to 5 pF.

29. Waveguide system according to claim 28, wherein the capacitance value of the third and/or fourth capacitor is respectively disposed at approximately 1.5 pF.

30. Waveguide system according to claim 26, wherein the third capacitor is connected to the first signal conductor of the differential waveguide and to a first output connection or the fourth capacitor is connected to the second signal conductor of the differential waveguide and to a second output connection.

31. Waveguide system according to claim 26, wherein the resistance value of the seventh ohmic resistor or eighth ohmic resistor is respectively disposed within the range from 10 ohms to 250 ohms.

32. Waveguide system according to claim 31, wherein the resistance value of the seventh and/or eighth ohmic resistor is respectively disposed within the range from 75 ohms to 150 ohms.

33. Waveguide system according to claim 32, wherein the resistance value of the seventh and/or eighth ohmic resistor is respectively disposed at approximately 125 ohms.

34. Waveguide system according to claim 26, wherein the rear network elements connect the common node to a circuit ground via a ninth ohmic resistor.

35. Waveguide system according to claim 34, wherein the resistance value of the ninth ohmic resistor is disposed within the range from 0 ohms to 250 ohms.

36. Waveguide system according to claim 35, wherein the resistance value of the ninth ohmic resistor is disposed within the range from from 0 ohms to 50 ohms.

37. Waveguide system according to claim 36, wherein the resistance value of the ninth ohmic resistor is disposed at approximately 20.5 ohms.

* * * * *